(12) United States Patent
Wirth et al.

(10) Patent No.: US 9,559,266 B2
(45) Date of Patent: Jan. 31, 2017

(54) LIGHTING APPARATUS INCLUDING AN OPTOELECTRONIC COMPONENT

(71) Applicant: OSRAM GmbH, Munich (DE)

(72) Inventors: Ralph Wirth, Lappersdorf (DE); Axel Kaltenbacher, Mintraching (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 14/786,573

(22) PCT Filed: Apr. 7, 2014

(86) PCT No.: PCT/EP2014/056925
§ 371 (c)(1),
(2) Date: Oct. 23, 2015

(87) PCT Pub. No.: WO2014/173670
PCT Pub. Date: Oct. 30, 2014

(65) Prior Publication Data
US 2016/0087161 A1    Mar. 24, 2016

(30) Foreign Application Priority Data

Apr. 25, 2013 (DE) .......... 10 2013 207 611

(51) Int. Cl.
*H01L 33/48* (2010.01)
*H01L 33/00* (2010.01)
(Continued)

(52) U.S. Cl.
CPC ............ *H01L 33/483* (2013.01); *H01L 24/19* (2013.01); *H01L 24/97* (2013.01);
(Continued)

(58) Field of Classification Search
CPC ...... H01L 24/19; H01L 24/97; H01L 25/0753; H01L 33/0095; H01L 33/483; H01L 33/486; H01L 33/52; H01L 33/62
See application file for complete search history.

(56) References Cited

U.S. PATENT DOCUMENTS 5,994,007 A * 11/1999 Sato .................. G03F 7/091
430/22
7,615,410 B2 * 11/2009 Goh .................. H01L 21/56
257/778

(Continued)

FOREIGN PATENT DOCUMENTS

DE    102011107892 A1    1/2013
EP       2487730 A2    8/2012

OTHER PUBLICATIONS

International Search Report based on application No. PCT/EP2014/056925 (3 pages + 2 pages English translation) dated Jun. 5, 2014.
(Continued)

*Primary Examiner* — Allan R Wilson
(74) *Attorney, Agent, or Firm* — Viering, Jentschura & Partner mbB

(57) ABSTRACT

The invention relates to an illumination device (1) specifically a packaged LED (2), which is embedded in a casing body leaving the bottom side of the LED (2) exposed; on the bottom side, a contacting element (7) is vacuum deposited onto the LED (2), which contacting element protrudes laterally above the LED (2) and allows on a macroscopic level for an electric contacting of the LED (2), namely by connection of flat surfaces, such as welding.

14 Claims, 4 Drawing Sheets

(51) Int. Cl.
*H01L 33/52* (2010.01)
*H01L 33/62* (2010.01)
*H01L 23/00* (2006.01)
*H01L 25/075* (2006.01)
*H01L 33/50* (2010.01)

(52) U.S. Cl.
CPC ...... H01L 25/0753 (2013.01); H01L 33/0095 (2013.01); H01L 33/486 (2013.01); H01L 33/52 (2013.01); H01L 33/62 (2013.01); H01L 33/505 (2013.01); H01L 2924/12036 (2013.01); H01L 2924/12041 (2013.01); H01L 2933/005 (2013.01); H01L 2933/0066 (2013.01)

(56) References Cited

U.S. PATENT DOCUMENTS

| | | | |
|---|---|---|---|
| 2006/0169994 A1 | 8/2006 | Tu et al. | |
| 2009/0309209 A1* | 12/2009 | Chen | H01L 21/568 257/690 |
| 2010/0046186 A1* | 2/2010 | Palm | H01L 24/18 361/777 |
| 2011/0260184 A1 | 10/2011 | Furuyama | |
| 2012/0098021 A1* | 4/2012 | Chan | H01L 33/62 257/99 |
| 2014/0077235 A1* | 3/2014 | Kwon | H01L 33/486 257/88 |

OTHER PUBLICATIONS

German Search Report based on application No. 10 2013 207 611.8 (5 pages) dated Feb. 13, 2014.

* cited by examiner

LIGHTING APPARATUS INCLUDING AN OPTOELECTRONIC COMPONENT

RELATED APPLICATIONS

The present application is a national stage entry according to 35 U.S.C. §371 of PCT application No.: PCT/EP2014/056925 filed on Apr. 7, 2014 which claims priority from German application No.: 10 2013 207 611.8 filed on Apr. 25, 2013, and is incorporated herein by reference in its entirety.

TECHNICAL FIELD

Various embodiments relate to a lighting apparatus including an optoelectronic component and to a method for producing said lighting apparatus.

BACKGROUND

The term "lighting apparatus" within the context of this disclosure relates to a housed optoelectronic component, i.e. a module, which can be fitted together with further modules, for example, on a printed circuit board. The optoelectronic component is a light-emitting component consisting of, for example, a semiconductive material (also abbreviated to "LED" in the context of this disclosure), for example an inorganic or generally also organic light-emitting diode.

In order to house such an LED, it is known from the related art to grip the component with a vacuum tool, for example, and to arrange said component on a conductor track structure which has usually already been encapsulated with molding compound by injection molding in advance (pre-molded leadframe). Once the component has been electrically conductively connected to the leadframe via bonding wires, it is encapsulated by casting with silicone; the silicone in this case fills a cavity which is laterally delimited by the molding compound and in which the component was placed at the start.

The present disclosure is based on the technical problem of specifying a housing for an optoelectronic component which is advantageous in comparison with the related art and a corresponding procedure for housing.

SUMMARY

Various embodiments provide a lighting apparatus including an optoelectronic component having an upper side configured as a light exit surface and a connection element on the opposite lower side, which connection element serves to make electrical contact with the component, including an enveloping body which at least partially envelopes the component but leaves free the lower side of the component, and including a flat first contact-making element, which is electrically conductively connected to the connection element, extends on the lower side of the component and protrudes laterally beyond the component in this lower-side extent, wherein the first contact-making element is metallized directly onto the connection element and a surface of the first contact-making element, which surface extends on the lower side of the component and faces away from the component, is provided as a free contact area configured for areally connecting the lighting apparatus on a macroscopic plane.

A lighting apparatus according to the present disclosure is characterized first by a comparatively simple design because the contact-making element firstly represents the interface with the macroscopic, for example with a printed circuit board, and secondly makes electrically conductive contact directly with the component as well. For example, in comparison with the related art described at the outset, it is therefore not necessary for a bonding wire for making contact with the component, on the one hand, and a leadframe for connection by soldering to a printed circuit board, for example, on the other hand, to be provided.

The contact-making element is metallized directly onto the connection element, which is part of the component; the connection element may be, for example, a metallization which has already previously been applied, for example, in the course of the component production (as part of a front-end process) (also referred to below as "LED metallization"). In the above-described housing method in accordance with the related art, contact is then made with the LED metallization applied as part of the front-end processing by a bonding wire.

The LED metallization can have, for example, a thickness of at least 250 nm, 500 nm, 700 nm, 800 nm or 900 nm; possible upper limits are, independently of the minimum thickness, 10 µm, 5 µm, 3 µm, 2 µm and 1.5 µm, respectively, for example. Possible materials for the LED metallization are for example (in each case as a layer sequence) titanium/platinum/gold (TiPtAu), titanium/palladium/gold (TiPdAu), titanium/nickel/palladium/gold (TiNiPdAu) or gold/tin (AuSn). In general, the connection element does not necessarily need to be a metallized or through-metallized region, however, but such a region can first be produced in the course of the production of the contact-making element; the connection element is generally a region provided for making electrical contact with the component, from which region through-contacts (vias) can be guided in the direction of the epitaxial layers, for example. In this case, with a housing in accordance with the present disclosure, for example, a process currently performed as part of front-end manufacture can be integrated in a back-end process ("application by metallization of the contact elements").

In accordance with the present disclosure, the contact-making element is "metallized", i.e. applied by metal deposition, onto the connection element of the component (preferably onto an LED metallization); the contact-making element is produced first over the course of the housing process, i.e. a previously separately produced contact-making element is not used, which can improve the electrical contact with the LED metallization and help to reduce the logistical complexity involved, for example.

The contact-making element can, for example, be deposited from a bath, without electricity and/or electrogalvanically, or applied by sputtering, vapor deposition, spraying or flame-spraying or else fused on.

The contact-making element can have, for example, a thickness of at least 1 µm, 5 µm, 10 µm, 20 µm or 30 µm; possible upper limits are, independently of the minimum thickness, 1500 µm, 1000 µm, 800 µm, 500 µm and 100 µm, respectively, for example.

Preferably, the contact-making element is integral, at least in a central region in respect of the height direction; "integral" to this extent means free of material limits either resulting from an interruption in the metallization and/or from a change in the metal applied by metallization. This integral nature relates at least to a central region, which can extend over at least 60%, 70% or 80% of the thickness of the contact-making element, for example.

Toward the connection element, i.e. "upward", the contact-making element can therefore have a comparatively thin layer of another metal initially deposited as a so-called seed layer, for example. Independently of this, a coating deviating from the volume material can secondly also be provided on the contact area, for example a coating which improves solderability and/or an anti-corrosion coating.

That surface of the first contact-making element which is remote from the component and is designed as a contact area toward the macroscopic plane represents an "areally connectable" surface; the component housed in accordance with the present disclosure can therefore be arranged on a printed circuit board, for example, and can therefore be connected by soldering, for example in a so-called reflow process. In general, "areally connecting" can mean soldering, diffusion soldering, sintering or adhesive bonding, for example; in addition, a corresponding connection to the macroscopic can also be produced, for example, by a bonding paste or by direct application, for example by formation of an alloy or a direct contact with a contact region on a printed circuit board/carrier plate, which is provided from the same material as the contact-making element. The feature "free contact area" does not of course generally exclude, for example, the presence of packaging for protection during transport or storage, for example a film covering the contact area. As regards an (imaginary) plane perpendicular to the height direction which passes centrally through the component, both the connection element and the contact-making element as well as the contact area lie on the same side, to be precise beneath said plane. In other words, the contact-making element does not extend "around the component", to the upper side of the component; the contact-making element guides the wiring, on the other hand, slightly to the side away from the component.

Preferably, the contact-making element (and therefore also the contact area) extends purely on the lower side of the component, i.e. the contact-making element protrudes beyond the component only in the lateral direction; an (imaginary) plane in which the lower side of the component lies therefore does not intersect the contact-making element in this case. In other words, the half space above the lower side of the component is then free of contact-making elements; the contact-making element to this extent has a particularly simple design and can be applied by metallization "in one go", for example.

In general, specifications such as "on the upper side"/"on the lower side" or "upper side"/"lower side" relate to the height direction, in respect of which the thickness, for example of the component, an LED metallization or the contact-making element, is also specified. The terms "beneath" and "above" also relate to the height direction, but additionally specify an alignment in the height direction, i.e. exclude an offset in the lateral direction. The height direction can, after fitting of the housed component, coincide with a normal on the corresponding carrier plate/printed circuit board, for example; a main propagation direction of the light which is downstream of the light exit surface and which is formed as the direction of center of gravity of the propagation directions weighted according to power, is generally in the height direction.

In the lateral direction, the width and the depth are specified; the lateral direction is perpendicular to the height direction.

In the case of a component housed in accordance with the present disclosure, the contact-making element protrudes laterally beyond the component; an (imaginary) plane which is fixed by a corresponding side face of the component, therefore intersects the contact-making element. In other words, "protrude laterally beyond the component" means that the component and the contact-making body (in particular the contact area thereof) partially overlap one another in a projection in the height direction onto a surface perpendicular to the height direction.

The contact-making element which protrudes beyond the component can be advantageous, for example, if the components tend to have a small width and depth and this width and depth tends also to decrease further; by virtue of the contact-making element and therefore the contact-making area being provided so as to protrude laterally beyond the component, the wiring is to a certain extent "spread apart", with the result that contact-making on the macroscopic plane is possible.

The contact-making element can protrude beyond the component in the lateral direction, for example by, with increasing preference in this order, at least 5%, 10% or 15% of the width of the component taken in the same direction; possible upper limits, which are independent of the lower limit, can be, for example, 100%, 80%, 60% or 40%.

The contact area of the contact-making element which is remote from the component (this is referred to using the term "contact area" without any further specification always within the scope of this disclosure) has, in a preferred configuration, an area of at least 0.25 mm$^2$ and/or a smallest lateral extent of at least 0.5 mm; the "smallest lateral extent" relates to the smaller of the two side edges, for example in the case of a non-square rectangular form.

Further possible minimum values for the area are, with increasing preference in this order, 0.5 mm$^2$, 0.75 mm$^2$ or 1 mm$^2$; upper limits which are independent of these lower limits can be, for example, 25 mm$^2$, 15 mm$^2$ and 5 mm$^2$. Further possible minimum values for the smallest lateral extent can be, with increasing preference in this order, 0.6 mm, 0.7 mm, 0.8 mm and 0.9 mm, and upper limits which are independent of these lower limits can be, for example, 5 mm, 3 mm and 1 mm. The contact area is therefore preferably provided with a comparatively large area; the housed component can be fitted directly on a carrier plate/printed circuit board via the contact area, for example by adhesive bonding or soldering of the contact area, i.e. is in the form of a surface-mounted component part (surface-mounted device, SMD).

In a configuration of the housed component, a second contact-making element is provided and is arranged on the lower side of the component; the second contact-making element is also metallized onto the component and protrudes laterally beyond said component, to be precise on a side of the component which is opposite the first contact-making element. All of the specifications (size, degree of lateral protrusion, etc.) disclosed for the first contact-making element are intended to be disclosed expressly also for the second and possibly a one or more further contact-making elements. By virtue of the contact-making elements therefore being passed out beyond the component on opposite sides, a maximum lateral "spread" can be achieved. Thus, even in the case of a component with comparatively small lateral dimensions, direct coupling in accordance with the present disclosure between the component plane (LED metallization) and the macroscopic plane, for example a printed circuit board, can be produced. In simple terms, the contact-making elements are guided away from the component in opposite directions in order to make available flat contact areas which are sufficiently well spaced apart from one another and which enable fitting of the housed component part by soldering, for example.

The first and second contact-making elements have, in a configuration, a minimum spacing, taken in the lateral direction, of at least 50 µm, with increasing preference in this order at least 100 µm, 150 µm and 180 µm; upper limits which are independent of this lower limit can be, for example, 3 mm, 2 mm and 1 mm.

Generally, in addition to the first and second contact-making elements provided in the configuration, further contact-making elements can of course also be provided, for example in the case of a component part including a plurality of components; i.e. in total three, four, five, six, seven or eight or else even more contact-making elements can be provided, for example. The contact-making elements can be arranged, for example, on two opposite sides of the component in divided form, in each case opposite one another in pairs.

In a configuration of the lighting apparatus according to the present disclosure, connection elements are provided only on the lower side of the component; in this case, at least two connection elements are provided on the lower side because the upper side of the component, which is in the form of a light exit surface, is free of connection elements and the electrical contact-making of the component requires at least two connection elements. A corresponding arrangement exclusively on the lower side corresponds to the concept of the simple design because no complex wiring around the component is required, but the connections can be guided away downward and laterally with a number of contact-making elements which corresponds to the number of connection elements. In a preferred embodiment, a light-reflecting reflective layer is arranged on the lower side of the component, to be precise preferably in such a way that a region of the component which is free of connection elements is completely covered by said reflective layer. The reflective layer can be provided, for example, on an inorganic or organic basis; generally, a metal, for example aluminum or silver, which can be applied as a coating and/or embedded in a matrix material, can also be provided, for example, for reflection purposes. Matrix materials filled with reflective particles are generally preferred, i.e. for example titanium dioxide particles in matrix material, for example in a silicone material.

The reflective layer may also be, for example, a reflector film, for example a microcellular PET film (MC PET); the reflector film can be reflective owing to the base material used and/or owing to a surface structuring, for example cavities introduced into the surface. Reflective ceramics which can be used as the reflective layer according to the present disclosure, for example as a so-called ceramic ink, are also known.

The reflective layer can be applied, for example, by physical and/or chemical deposition methods, for example by sputtering, printing, doctoring, dispensing, lithographically structuring, abrasively structuring (microsandblasting), jetting, punching, spraying (onto previously applied adhesive); direct application is also possible, in which the connection results from kinetic acceleration of the particles.

The reflective layer in any case serves to reflect light emitted downward, so that this light is reflected upward and (partially) exits through the light exit surface on the upper side of the component. In a preferred configuration, an LED including a substrate which is at least partially transmissive to the LED light is provided as component, for example a sapphire substrate.

To this extent, the component per se can actually be designed for light emission on the "lower side" provided with the connection elements, which lower side represents the upper side in the case of conventional fitting. In a housing according to the present disclosure, such a sapphire component is therefore to a certain extent fitted the opposite way round, wherein the reflective layer prevents light from exiting on the lower side (which is provided as upper side and corresponding light exit surface in the case of a conventional housing) so that the light exits on the upper side (in the case of a housing according to the present disclosure). Insofar as reference is made to the "light exit surface" within the scope of this disclosure, therefore, this means the light exit surface resulting from the housing according to the present disclosure, which does not necessarily need to correspond to the light exit surface specified by, for example, a component manufacturer as light exit surface. It goes without saying that the light in this case does not need to emerge through the light exit surface alone, but it can also exit (partially) through side faces of the component, for example.

Secondly, however, in the case of a component with a transmissive substrate, for example a sapphire substrate, a reflective layer can also already be provided during the component manufacture, i.e. as part of a front-end process, or a component can generally be used whose light exit surface per se is already arranged opposite the connection elements.

The connection elements generally provided from metal can also have a reflective effect themselves, which can additionally be promoted by the selection of a suitable material; to this extent, in addition to silver and/or aluminum, chromium, titanium and/or titanium tungsten can also be preferred. In this case, the connection element does not need to be provided from silver, for example, over its entire thickness, but it is also possible for only a thin, initially deposited layer of the comparatively costly silver material to be provided. For example, in conjunction with a connection element consisting of silver or aluminum, a titanium dioxide, silicon dioxide and/or aluminum oxide layer can also be provided toward the enveloping body and/or the component (in a region not intended for electrical contact-making) in relation to the order of application beneath the connection element (based on the orientation of the housing above this). In a preferred configuration, a reflective layer is (particularly preferably also) provided in a region next to the component, on the lower side of the enveloping body. The reflective layer can therefore reflect light emitted downward at an angle upward at an angle and can make this light at least partially usable.

In a embodiment, an electrically insulating insulation layer is provided and is arranged, based on the height direction, between the connection element and the contact-making element; this arrangement is provided in regions, i.e. in a proportion of the area of the connection element, for example in an area proportion of at least 5%, 10% or 15%; possible upper limits can be 40%, 30% and 20%, respectively. In general, a smallest lateral extent of the connection element can be approximately at least 30 µm, 40 µm and 50 µm, respectively; upper limits which are independent of these lower limits can be, for example, depending on the size of the component, 1000 µm, 800 µm and 600 µm, respectively, for example in the case of a component with an edge length of one millimeter.

The insulation layer therefore covers the connection element partially, to be precise preferably a peripheral region of the connection element, particularly preferably circumferentially. When looking down onto the component, the insulation layer therefore then leaves a central region of the connection element free; the insulation layer masks the connection element and thus determines the contact region between the connection element and the contact-making element for the application of the contact-making element by metallization. Using the insulation layer which masks the connection element and preferably leaves free a central region of the connection element, a certain lack of sensitivity with respect to a lateral offset during the application by metallization can be achieved, for example, which can provide advantages in mass production, for example.

In a configuration, an insulation layer is provided beneath a lateral contact region between the component and the enveloping body, in which, therefore, a side face of the component adjoins the enveloping body (particularly preferably in conjunction with the above-described "masking" arrangement). The insulation layer is preferably provided with a lateral overlap both in the direction of the component and of the enveloping body; the overlap can be, for example, in each case at least 20 µm, 30 µm, 50 µm and 100 µm, respectively, and, independently of this lower limit, at most 500 µm, 400 µm and 300 µm, respectively, for example. A correspondingly arranged insulation layer which covers the contact region between the enveloping body and the component preferably circumferentially around the entire component can help prevent, for example, a formation of an electrical short circuit along a side face with respect to the epitaxial layers of the component, for example during application by metallization of the contact-making element. The insulation layer can provide advantages in particular also in the case of the effect of moisture, for example in the case of a delamination between the component and the enveloping body and can thus also help avoid electrical malfunctions.

In a configuration, a region of the lower side of the component which is free of connection elements is provided with an insulation layer, particularly preferably in conjunction with the above-described "masking" arrangement and the covering of the contact region. For example in the case of a plurality of connection elements provided on the lower side of the component, the occurrence of an electrical short circuit between said connection elements can thus also be prevented, for example. Such an insulation layer can be provided, for example for its part on its rear side (based on the housing at the bottom), with an additional layer, for example in the case of a transmissive insulation layer with a reflective layer applied locally, for example.

In principle all dielectrics which are known from front-end manufacture (wafer level dielectrics) and can be photolithographically structured, such as imide, WPR (for example by JSR Micro), benzocyclobutene (BCB) or epoxide, can be used in principle as insulation layer material; an insulating paint can also be provided, for example a solder resist. The application can also be performed using a printing technology, for example, for example using a so-called inkjet method or for example using templates or screenprinting.

In addition, the insulation layer material can also be, for example, silicon dioxide ($SiO_2$), silicon nitride (SiN) or $SiO_xN_y$. The insulation layer can be provided, for example, from a matrix material, in which reflective particles can also be embedded, for example. To this extent, all of the arrangement possibilities described above for the reflective layer are intended to be disclosed expressly also for the electrically insulating reflective layer.

The provision of a matrix material (irrelevant whether for a reflective and/or an insulation layer) can also be advantageous in addition insofar as, in a preferred configuration, in addition a material improving the heat conduction of said matrix material can be embedded, for example fused silica or cristobalite particles. The reflective/insulation layer can thus also help to improve the thermal balance of the housing; in the case of a reflective layer, the material improving the heat conduction should, in the spectral range of the light emitted by the component or a conversion material, demonstrate only low absorption in order not to impair the reflective properties.

In an embodiment, the enveloping body covers the upper side of the component and further preferably all of the side faces of the component, i.e. in the case of a conventional rectangular component geometry, all four side faces. The enveloping body envelopes the component preferably completely, therefore, apart from the lower side, with the result that the component is to a certain extent protected from environmental influences, for example from the effect of moisture.

In a development, either conversion material is embedded in the enveloping body covering the upper side of the component, i.e. the enveloping body is provided from a matrix material containing a conversion material, or the conversion material itself represents the enveloping body. In both cases, the conversion material is used for at least partially converting the light emitted by the component into light with a longer wavelength. The light emitted by the housed component can be a superimposition of the light emitted by the component and the conversion material, which is also referred to as "partial conversion"; secondly, in the case of a so-called "full conversion", the longer-wavelength light emitted by the conversion material can also be present alone downstream of the conversion material. The conversion material is also referred to as "luminophore".

The enveloping body can be applied or spun on in a printing method or by doctoring, by being sprayed on or cast on or by being dispensed, for example. In addition, the component can also be immersed or pressed into the enveloping body, for example.

It is provided that the enveloping body is either applied in a casting method, in particular in an injection-molding method, or provided as a film and deep-drawn or laminated on, for example. In this case, further preferably a matrix material, for example silicone in the case of casting, in which, as described above, particularly preferably conversion material is embedded, is provided as enveloping body. In general, the enveloping body is integral in a preferred configuration.

The present disclosure also relates to a method for producing a component housed in the above-described manner, wherein the enveloping body is applied to the component in such a way that the lower side of the component with the connection element remains free. In general, the component can also be initially completely enveloped by the material of the enveloping body, for example, and the lower side of the component can then be exposed; preferably, the lower side of the component is not already covered by the enveloping body material during application thereof, however, and accordingly then does not need to be exposed.

In a further method step, which can generally also take place prior to application of the enveloping body, but preferably is performed thereafter, the first contact-making element is produced, i.e. is metallized onto the connection element. The plurality of contact-making elements provided in a preferred configuration is particularly preferably applied by metallization at the same time.

The application by metallization can take place, for example, in a bath, without the application of current and/or electrogalvanically; in addition, the contact-making element can also be applied by sputtering, vapor deposition, spraying or flame spraying or else fused on.

The production is particularly preferably performed in parallel fashion, wherein a multiplicity of components are provided on a common carrier. Preferably, this carrier is a separation carrier, on which the component parts are arranged in any case during/after separation by sawing of a wafer, for example, for example a so-called sawing film.

In the method for housing known from the relate art, the components are taken individually from such a separation carrier and placed onto in each case one dedicated copper leadframe (pick and place); in contrast, in the production according to the present disclosure, it is advantageously possible to dispense with this time-consuming method step and the component parts provided on the separation carrier can be housed in parallel. Therefore, for example, even a few hundred components can be housed at the same time, which can increase throughput.

The enveloping bodies can be applied to all of the components provided on the common carrier in a common method step, for example, for example by the above-described deep-drawing of a film provided as enveloping body. However, the enveloping bodies can also be cast on, wherein in each case one dedicated cavity can be assigned to the components with a die, for example; the cavities can be filled one after the other or in parallel.

However, a die can also be provided which frees the enveloping bodies of the individual components initially as a cohesive body so that, only once separation has taken place, for example by sawing, lasering, punching or water jet cutting, component parts are present which have been separated by sectional severing of the cohesive enveloping body. Preferably, the contact-making elements in this case do not extend as far as into the sections along which severing is performed (these can be referred to as sawing frame, for example), i.e. only the enveloping body needs to be severed during the separation process.

In order to simplify the separation process, the enveloping bodies can also be linked to one another via webs, so-called material links, for example, with the result that less material needs to be severed during the separation process (even only the material links) and to some extent even a predetermined breaking point is preset.

The present disclosure also relates to such a lighting apparatus arrangement in which adjacent lighting apparatuses are connected via material links formed integrally with the enveloping bodies. Thus, for example, the risk of a loss of individual component parts prior to fitting thereof can also be reduced.

In respect of production, the contact-making elements are preferably metallized onto the connection elements of the plurality of components in a common method step, i.e. at the same time, particularly preferably after the application of the enveloping bodies. In this case, the components can be held together, for example, via a common carrier, which generally does not correspond to the carrier provided during application of the enveloping bodies (the components can therefore be transferred from the sawing film to a different film, for example). However, the components can also be held together without such a carrier by a (still continuous) enveloping body, for example.

The present disclosure also relates to the use of an above-described lighting apparatus for areally connecting, in particular connecting by joining (for example soldering or adhesive bonding), on a macroscopic plane, i.e. via the contact area of the contact-making element which is remote from the component, to a carrier plate/printed circuit board, for example. Particularly preferably, the housed component is used as an SMD component part, which is further preferably soldered on.

BRIEF DESCRIPTION OF THE DRAWINGS

In the drawings, like reference characters generally refer to the same parts throughout the different views. The draw-ings are not necessarily to scale, emphasis instead generally being placed upon illustrating the principles of the disclosed embodiments. In the following description, various embodiments described with reference to the following drawings, in which.

DETAILED DESCRIPTION

Figure 1:
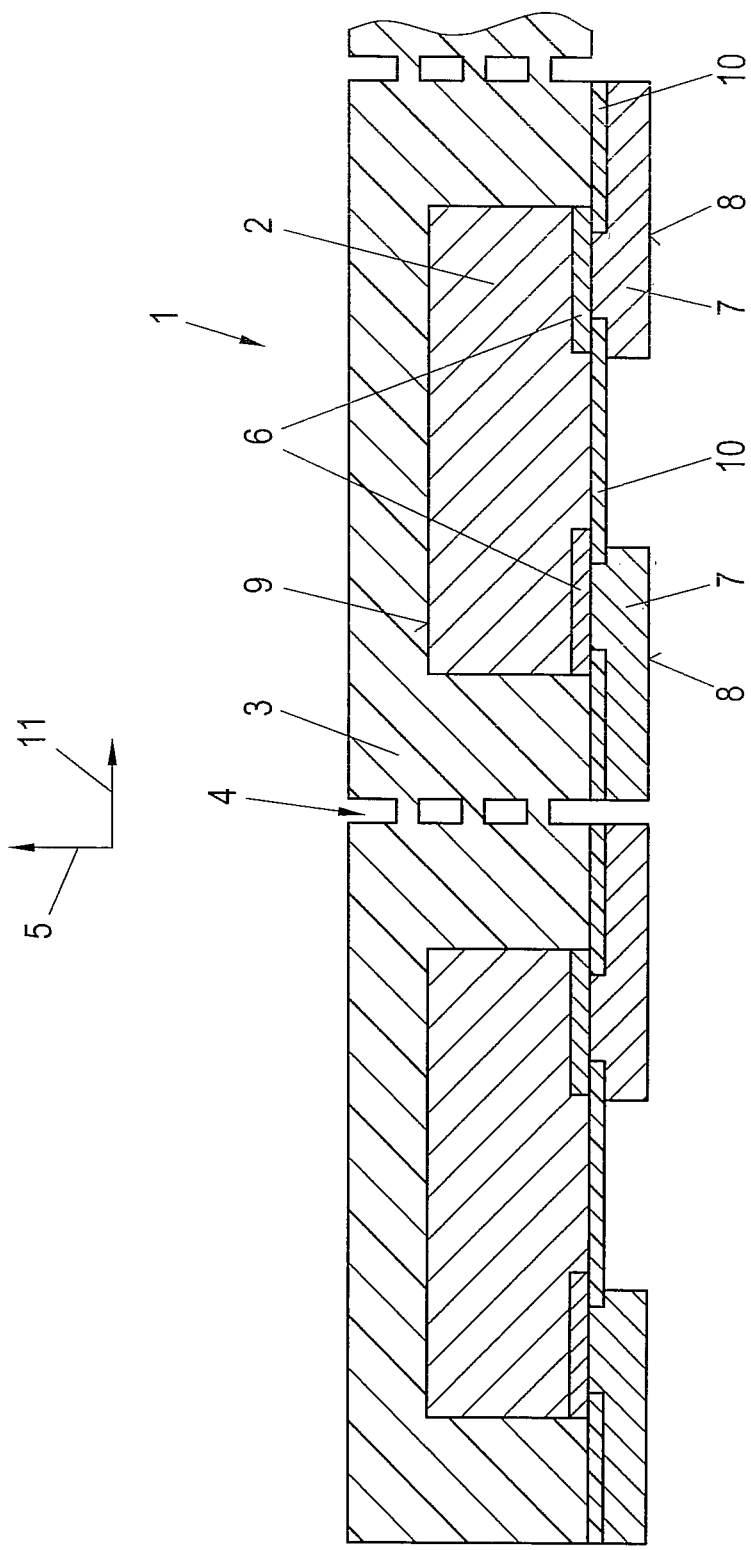
FIG. 1 shows a component housed according to the present disclosure having a reflective layer.

FIG. 1 shows, as a first example of a component part 1 according to the present disclosure (lighting apparatus), an LED 2, which is enveloped by a cast enveloping body 3. The figure shows a state even prior to the separation of the otherwise completely housed component parts 1; said component parts are still joined to one another via material links 4 formed integrally with the enveloping body 3. Such material links 4 are of course not necessarily provided; an integrally applied enveloping body could also be separated without material links 4, to be precise by separation along the (then continuous) regions in which the material links 4 are provided in FIGS. 1 and 2.

The sectional illustration furthermore shows the connection elements 6 (LED metallization) provided in respect of the height direction 5 on the lower side of the LED 2, in the present case one anode contact and one cathode contact per LED 2. The LED 2 in FIG. 1 is to this extent fitted the opposite way round than, in a conventional housing, the side opposite the LED metallization 6 being provided as lower side and being fitted on a carrier; the correspondingly upper LED metallization would be connected to generally one leadframe via bonding wires.

In this case, the LED metallization 6 points downward, and contact-making elements 7 are metallized onto the LED metallization 6, to be precise by initial sputtering of a seed layer; then, a lithographically exposed material is applied thereto, and the regions for the contact-making elements 7 are photolithographically structured (the seed layer is exposed in regions). After deposition of a copper layer thereon electrochemically in a bath, the photolithographically structurable material and then also the seed layer beneath the photolithographically structurable material are removed.

The lower surface of the contact-making elements 7 which is remote from the LED 2 is in the form of a solderable contact area 8; the lighting apparatus 1 provided as SMD component part is connected over a large area to a printed circuit board via the contact areas 8. The contact-making elements 7 are in each case guided laterally outwards away from the LED 2, with the result that the wiring is spread apart.

A silicone molding in which conversion material (luminophore particles) is embedded is provided as enveloping body 3.

The component has a height of 200 μm (for example depending on the required quantity of conversion material, a higher component is also possible); the light generation takes place close to the LED metallization 6, several micrometers above said LED metallization.

The epitaxial layers between which the pn transition is formed are in this case provided "on" a sapphire substrate (beneath a sapphire substrate in the figure); the sapphire substrate has a height of approximately 100 μm and extends as far as the upper side 9 of the LED 2. In an LED 2 housed in accordance with the present disclosure, this upper side is provided as light exit surface 9.

In order to be able to also make light emitted downward usable and thus to increase the efficiency of the component part 1, a reflective layer 10 is provided on the lower side of the LED 2 and the enveloping body 3. An electrically insulating matrix material, in this case silicone, in which titanium dioxide particles are embedded in order to set the reflective properties is provided for the reflective layer 10. In addition to this, the reflective layer 10 at the same time is also used for insulation purposes and can help avoid the occurrence of electrical short circuits.

The reflective/insulation layer covers the lower side of the enveloping body 3 and that region of the lower side of the LED which is free from the LED metallization 6 completely. In addition, the reflective/insulation layer 10 also in each case covers a peripheral region of the LED metallization 6; the overlap in the lateral direction 11 is 10 μm.

Figure 2:
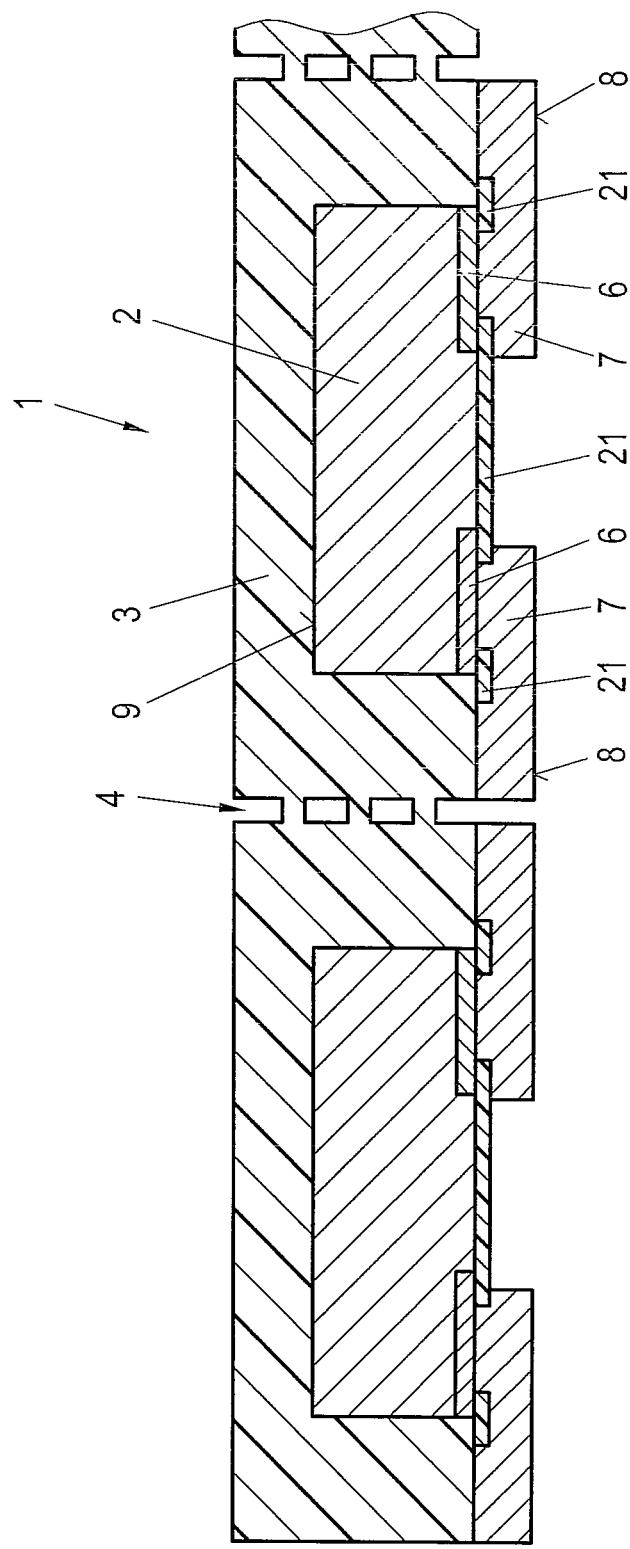
FIG. 2 shows a component housed according to the present disclosure having a non-reflective insulation layer.

FIG. 2 shows a further embodiment according to the present disclosure, in which, as in the case of that shown in FIG. 1, an LED 2 is embedded in an enveloping body 3 provided from silicone material. In turn, the state prior to the separation of the component parts 1 is shown; said component parts are still joined to one another via the material links 4.

In contrast to the embodiment shown in FIG. 1, in that as shown in FIG. 2 no reflective layer is provided on the lower side of the LED 2, however; instead, the LED 2 is already per se designed for light emission on the upper side; said upper side again forms the light exit surface 9. In the case of the LED 2 in the embodiment shown in FIG. 2, the light exit surface 9 is therefore already arranged per se on the side opposite the connection elements 6 (the LED metallization), which is also referred to as flip-chip technology. To this extent, no reflective layer reflecting the light upward is required on the housing side.

However, an electrically insulating insulation layer 21, in this case consisting of silicon nitride, is provided on the lower side of the LED 2. The insulation layer 21 provided between the connection elements 6 can help prevent the formation of electrical short circuits between the connection elements 6 and can also mechanically protect the lower side of the LED 2 to a certain extent; for example damage during fitting of the component part 1 on a printed circuit board can thus be prevented.

In addition, the insulation layer 21 is also provided such that it is aligned with the side faces of the LED 2, i.e. it covers, when viewed from below, a contact region of the LED side faces with the enveloping body 3. Thus, for example, in the case of a delamination of the enveloping body 3 from one of the side faces of the LED 2, the occurrence of an electrical short circuit can be prevented; such an electrical short circuit could be formed, for example, even during production if, during the application by metallization of the contact-making element 7, metal accumulates in the interspace between the LED 2 and the enveloping body 3 and reaches the epitaxial layers.

The insulation layer 21 is nevertheless provided so as to protrude only 15 μm laterally outward beyond the LED 2 because in this way as small a proportion of the upper side of the contact-making elements 7 as possible is covered. The contact-making elements 7 provided from sputtered aluminum in this exemplary embodiment also have a certain reflective function; the surface region of the contact-making elements 7 which is arranged laterally next to the LED 2 can reflect light emitted downward partially by the conversion material upward, for example, and thus make this light usable.

Figure 3A:
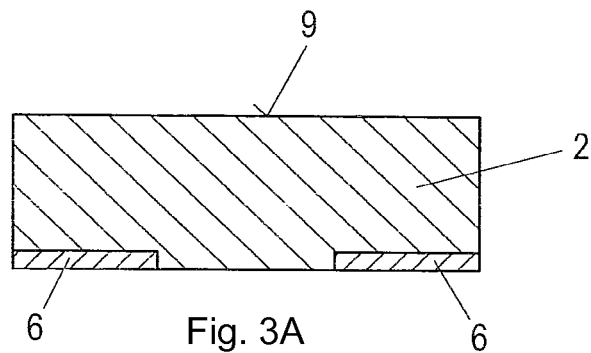
FIGS. 3A to 3C show a component housed by a deep-drawn film.
Figure 3B:
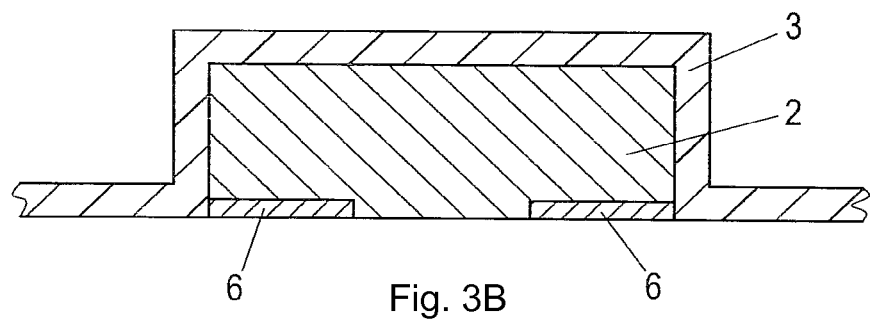
Figure 3C:
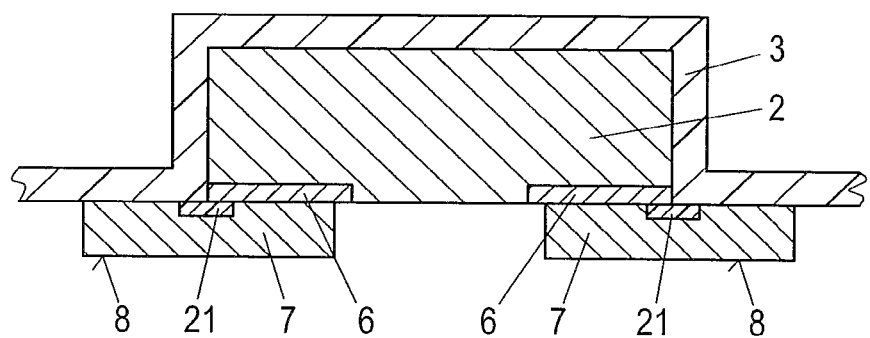

FIGS. 3A to 3C show a further embodiment and consequently different steps for the production thereof. Thus, FIG. 3A illustrates the as yet unhoused LED 2 with connection elements 6 arranged opposite the light exit surface 9 on the lower side (flip-chip technology).

In the embodiment shown in FIGS. 3A to 3C, the enveloping body 3 is not cast on as in the case of the exemplary embodiments shown in FIGS. 1 and 2 but is provided as a film. The LED 2 is to a certain extent printed as a drawing punch into the only previously crosslinked phosphor film (for example AF-500 ShinETSU), i.e. the enveloping body 3 is produced by deep-drawing of the phosphor film.

After this shaping, the phosphor film 3 with LEDs 2 embedded therein (a multiplicity of LEDs 2 are embedded in the same film in parallel) is crosslinked at elevated temperature (t=150° C.). Then, the film 3 substantially maintains its shape, i.e. holds the LEDs 2 with a certain degree of mechanical stability.

After deposition of the insulation layer 21, in this case WPR, the contact-making elements 7 provided from copper are deposited from a bath initially without the use of current and then electrogalvanically (cf. the explanations with respect to the exemplary embodiment shown in FIG. 1).

The insulation layer 21 in the embodiment shown in FIG. 3C is only provided so as to be aligned with the lateral contact region of LED side faces/film in order to prevent a formation of short circuits to the epitaxial layers.

The situation shown in FIG. 3C shows the state prior to the separation of the component parts 1; the film 3 is severed aligned with the respectively outer edges of the contact-making elements 7.

The LEDs 2 thus housed can be connected to a printed circuit board, for example, by a conductive adhesive or a solder via the contact areas 8. The contact-making elements 7 are also used for mechanical stabilization, in particular of the region of the component part which is laterally outside the LED 2, in addition to for electrical contact-making of the connection elements 3.

Figure 4A:
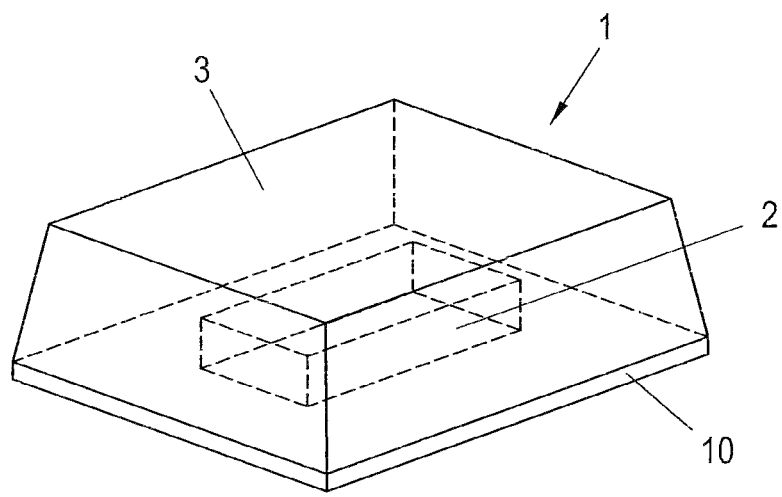
FIGS. 4A and 4B show a component housed according to the present disclosure in an angled view.
Figure 4B:
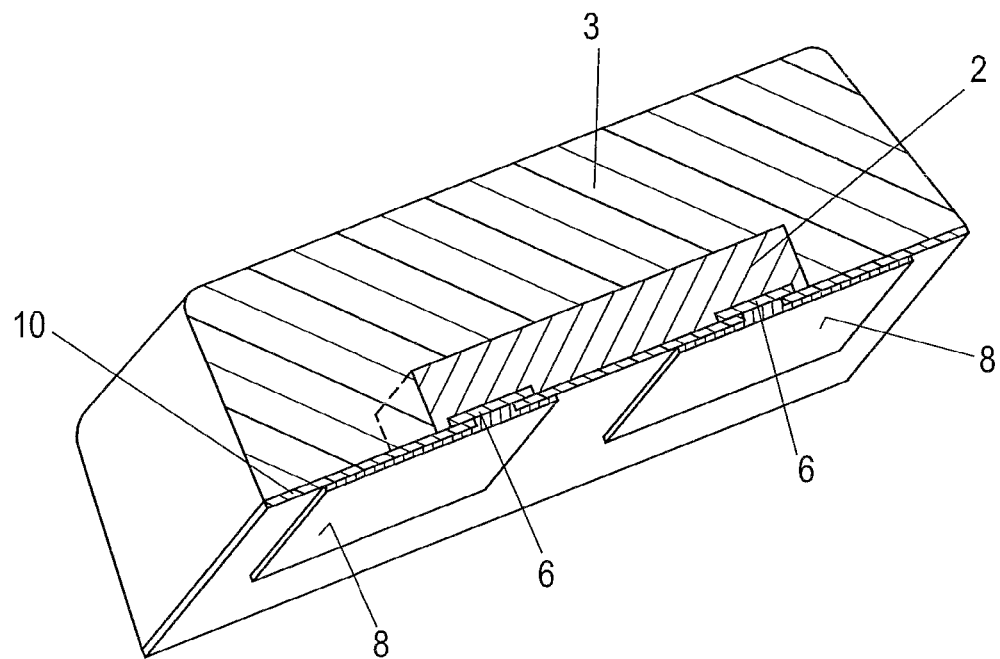

FIGS. 4A and 4B show a component part 1 with a design which is in principle similar to the embodiment shown in FIG. 1, i.e. an LED 2 cast in silicone material as an enveloping body 3 with a reflective layer 10 arranged beneath the LED 2 and the enveloping body 3.

FIG. 4A shows a plan view at an angle of the component part 1, as it would be visible after fitting on a carrier plate, for example (the contact-making elements 7 are below and are therefore not illustrated for reasons of clarity).

In the sectioned view at an angle from below shown in FIG. 4B, the contact-making elements 7 with the large-area contact areas 8 are shown. Apart from the contact region between the LED metallization 6 and the contact-making elements 7, the contact-making elements 7 lie on the reflective layer 10, which at the same time also is used for electrical insulation purposes and can help avoid short circuits between the contact-making elements 7 and the epitaxial layers.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting apparatus comprising: an optoelectronic component having an upper side configured as a light exit surface and a connection element on the opposite lower side, which connection element serves to make electrical contact with the component,
   an enveloping body which at least partially envelopes the component but leaves free the lower side of the component which is opposite the upper side, and
   a flat first contact-making element, which is electrically conductively connected to the connection element, extends on the lower side of the component and protrudes laterally beyond the component in this lower-side extent,
   wherein the first contact-making element is metallized directly onto the connection element and a surface of the first contact-making element, which surface extends on the lower side of the component and faces away from the component, is provided as a free contact area configured for areally connecting the lighting apparatus on a macroscopic plane,
   wherein the contact area has at least 0.25 mm$^2$.

2. The lighting apparatus as claimed in claim 1, wherein the contact area has a smallest lateral extent of at least 0.5 mm.

3. The lighting apparatus as claimed in claim 1, further comprising a second contact-making element, which is arranged on the lower side of the component and protrudes laterally beyond said component, to be precise on a side of the component which is opposite the first contact-making element.

4. The lighting apparatus as claimed in claim 1, further comprising a second contact-making element, which is arranged on the lower side of the component and has a spacing of at least 50 µm from the first contact-making element.

5. The lighting apparatus as claimed in claim 1, wherein connection elements are provided purely on the lower side of the component, and the upper side of the component, which upper side is configured as the light exit surface, is free of connection elements.

6. The lighting apparatus as claimed in claim 1, wherein a light-reflecting reflective layer is provided, which reflective layer is arranged on the lower side of the component.

7. The lighting apparatus as claimed in claim 6, wherein a light-reflecting reflective layer is provided, which reflective layer is arranged in a region adjacent to the component, on the lower side of the enveloping body.

8. The lighting apparatus as claimed in claim 1, wherein an electrically insulating insulation layer is provided, which insulation layer is arranged in a region of the connection element with respect to a height direction between the connection element and the contact-making element.

9. The lighting apparatus as claimed in claim 1, in which an electrically insulating insulation layer is provided, which insulation layer is arranged beneath a lateral contact region of the component and the enveloping body.

10. The lighting apparatus as claimed in claim 1, wherein the enveloping body covers the upper side of the component, and wherein one of conversion material embedded in the enveloping body and the enveloping body consisting of conversion material is provided, wherein the conversion material is designed to at least partially convert the light emitted by the component.

11. The lighting apparatus as claimed in claim 1, wherein the enveloping body is one of a cast, molding and a film.

12. A lighting apparatus arrangement comprising a plurality of lighting apparatuses,
   the lighting apparatus comprising:
      an optoelectronic component having an upper side configured as a light exit surface and a connection element on the opposite lower side, which connection element serves to make electrical contact with the component,
      an enveloping body which at least partially envelopes the component but leaves free the lower side of the component which is opposite the upper side, and
      a flat first contact-making element, which is electrically conductively connected to the connection element, extends on the lower side of the component and protrudes laterally beyond the component in this lower-side extent,
   wherein the first contact-making element is metallized directly onto the connection element and a surface of the first contact-making element, which surface extends on the lower side of the component and faces away from the component, is provided as a free contact area configured for areally connecting the lighting apparatus on a macroscopic plane
   wherein adjacent lighting apparatuses are connected to one another via material links formed integrally with the enveloping bodies
   wherein the contact area has at least 0.25 mm$^2$.

13. A method for producing a lighting apparatus, the method comprising:
   providing an optoelectronic component comprising a connection element, which serves to make electrical contact with the component;
   applying an enveloping body which at least partially envelopes the component but leaves free a lower side of the component with the connection element; and
   producing a first contact-making element, which protrudes laterally beyond the component, by metallizing the first contact-making element onto the connection element,
   wherein that surface of the first contact-making element which is remote from the component is provided as a free contact area which is designed to areally connect the lighting apparatus on a macroscopic plane,
   wherein the contact area has at least 0.25 mm$^2$.

14. The method as claimed in claim 13, wherein a multiplicity of components is provided on a common carrier, and the contact-making elements are metallized onto the connection elements in a common method step, and preferably also the enveloping bodies are applied to the components in a common method step.

* * * * *